United States Patent
Grimm et al.

(10) Patent No.: US 10,446,497 B2
(45) Date of Patent: Oct. 15, 2019

(54) COMBINED SOURCE AND BASE CONTACT FOR A FIELD EFFECT TRANSISTOR

(71) Applicant: Microchip Technology Incorporated, Chandler, AZ (US)

(72) Inventors: Dan Grimm, Mesa, AZ (US); Gregory Dix, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 267 days.

(21) Appl. No.: 15/471,726

(22) Filed: Mar. 28, 2017

(65) Prior Publication Data

US 2017/0287835 A1    Oct. 5, 2017

Related U.S. Application Data

(60) Provisional application No. 62/314,870, filed on Mar. 29, 2016.

(51) Int. Cl.
*H01L 29/78*  (2006.01)
*H01L 23/535*  (2006.01)
(Continued)

(52) U.S. Cl.
CPC .......... *H01L 23/535* (2013.01); *H01L 21/265* (2013.01); *H01L 21/283* (2013.01);
(Continued)

(58) Field of Classification Search
CPC ........ H01L 29/66; H01L 29/78; H01L 23/522
See application file for complete search history.

(56) References Cited

U.S. PATENT DOCUMENTS

| 8,937,351 B2 | 1/2015 | Dix et al. ............. 257/341 |
| 2005/0205945 A1* | 9/2005 | Lee ............... H01L 29/1037 257/401 |

(Continued)

FOREIGN PATENT DOCUMENTS

| EP | 0255970 A2 | 2/1988 | ........... H01L 21/336 |
| JP | 2000106434 A | 4/2000 | ........... H01L 29/78 |
| WO | 2012/071299 A2 | 5/2012 | ........... H01L 21/336 |

OTHER PUBLICATIONS

Ji, In-Hwan et al., "New Power MOSFET Employing Segmented Trench Body Contact for Improving the Avalanche Energy," Proceedings of the 20th International Symposium on Power Semiconductor Devices & IC's, pp. 115-118, May 18, 2008.

(Continued)

*Primary Examiner* — Evren Seven
(74) *Attorney, Agent, or Firm* — Slayden Grubert Beard PLLC

(57) ABSTRACT

The present disclosure relates to semiconductor devices. The teachings thereof may be embodied in metal oxide semiconductor field effect transistors (MOSFET) and methods for their manufacture. Some embodiments may include: depositing a base within an epitaxial layer; implanting a source implant extending into the base, wherein the epitaxial layer, the base, and the source implant form a continuous plane surface; depositing an insulating layer on the continuous plane surface forming a gate in contact with both the epitaxial layer and the base; opening a contact groove through the insulating layer to expose a central portion of the source implant; depositing a layer of photoresist on top of the insulating layer above exposed portions of the source implant; patterning a set of stripes in the photoresist, each stripe perpendicular to the contact groove; etching the set of stripes with an etch chemistry selective to the insulating layer; and filling the contact groove with a conductive (Continued)

material creating a base-source contact groove reaching through the insulating layer to the surface of the source implant and comprising a plurality of sections spaced apart from each other reaching through the source implant into the base.

8 Claims, 6 Drawing Sheets

(51) Int. Cl.
*H01L 21/265* (2006.01)
*H01L 21/283* (2006.01)
*H01L 21/311* (2006.01)
*H01L 21/768* (2006.01)
*H01L 25/065* (2006.01)
*H01L 29/417* (2006.01)
*H01L 29/66* (2006.01)
*H01L 29/06* (2006.01)
*H01L 23/00* (2006.01)
*H01L 27/092* (2006.01)

(52) U.S. Cl.
CPC ... *H01L 21/31111* (2013.01); *H01L 21/31144* (2013.01); *H01L 21/76895* (2013.01); *H01L 25/0655* (2013.01); *H01L 29/4175* (2013.01); *H01L 29/41766* (2013.01); *H01L 29/41775* (2013.01); *H01L 29/66727* (2013.01); *H01L 29/7802* (2013.01); *H01L 24/42* (2013.01); *H01L 24/85* (2013.01); *H01L 27/0922* (2013.01); *H01L 29/0696* (2013.01)

(56) References Cited

U.S. PATENT DOCUMENTS

| | | | |
|---|---|---|---|
| 2011/0233759 A1 | 9/2011 | Shiga | 257/735 |
| 2012/0126406 A1* | 5/2012 | Dix | H01L 23/4824 |
| | | | 257/738 |
| 2014/0246722 A1* | 9/2014 | Dix | H01L 29/78 |
| | | | 257/341 |
| 2015/0372090 A1 | 12/2015 | Oosawa et al. | 257/331 |
| 2018/0026131 A1* | 1/2018 | Kurosaki | H01L 29/7813 |
| | | | 257/59 |
| 2018/0182886 A1* | 6/2018 | Kobayashi | H01L 29/7396 |
| 2018/0350943 A1* | 12/2018 | Bartolf | H01L 29/41708 |

OTHER PUBLICATIONS

International Search Report and Written Opinion, Application No. PCT/US2017/024737, 15 pages, dated Jun. 13, 2017.

* cited by examiner

COMBINED SOURCE AND BASE CONTACT FOR A FIELD EFFECT TRANSISTOR

RELATED PATENT APPLICATION

This application claims priority to U.S. Provisional Patent Application No. 62/314,870 filed Mar. 29, 2016; which is hereby incorporated by reference herein for all purposes.

TECHNICAL FIELD

The present disclosure relates to semiconductor devices. The teachings thereof may be embodied in metal oxide semiconductor field effect transistors (MOSFET) and methods for their manufacture.

BACKGROUND

Power MOSFETs include metal wires deposited to connect source elements to one another and to connect drain elements to one another, usually in parallel. Typically, a metal film is deposited over a dielectric layer on a semiconductor wafer. The metal film is patterned and etched to leave the required metal wires. The metal wires make contact with various active areas (e.g., the drain areas, source areas, and/or gates) using vias. Vias are holes previously etched in the dielectric layer then filled with a conductor such as tungsten (e.g., using chemical vapor deposition or CVD). For more complicated connections, additional layers of metal may be separated by additional insulating layers and connected to one another by further vias therethrough. U.S. Pat. No. 8,937,351 entitled "Power MOS Transistor with Improved Metal Contact" relates to MOSFETs and is hereby incorporated by reference in its entirety.

FIG. 1A is a drawing showing a cross section taken through a portion of a prior art MOSFET 100 having a N-type epitaxial layer 110, a P-type base 120 disposed therein, and an N-type source implant 130 implanted into the base 120. MOSFET 100 also includes gates 140 and contacts 150 connecting base 120 and source implant 130. Contact 150 comprises a conductor filling a via extending through layer 160 and source implant 130 into the base 120.

FIG. 1B shows a side view along line 1B from FIG. 1A, another cross-section of MOSFET 100 taken perpendicular to the cross-section of FIG. 1A. As may be seen in FIG. 1B, each contact 150 makes a connection with base 120 along the bottom 156 of the contact 150 and along the lower portion 154 of the sides of the contact 150. Connection between contact 150 and source implant 130 is at side portions 152 of contact 150 along the thickness of source implant 130.

SUMMARY

The teachings of the present disclosure may be embodied in metal oxide semiconductor field effect transistors (MOSFET) and methods for their manufacture. Some embodiments may include methods for manufacturing a field effect transistor with a transistor cell.

In some embodiments, a method may include: depositing a base within an epitaxial layer; implanting a source implant extending into the base, wherein the epitaxial layer, the base, and the source implant form a continuous plane surface; depositing an insulating layer on the continuous plane surface forming a gate in contact with both the epitaxial layer and the base; opening a contact groove through the insulating layer to expose a central portion of the source implant; depositing a layer of photoresist on top of the insulating layer above exposed portions of the source implant; patterning a set of stripes in the photoresist, each stripe perpendicular to the contact groove; etching the set of stripes with an etch chemistry selective to the insulating layer; and filling the contact groove with a conductive material creating a base-source contact groove reaching through the insulating layer to the surface of the source implant and comprising a plurality of sections spaced apart from each other reaching through the source implant into the base.

In some embodiments, each of the plurality of sections is equally spaced apart.

In some embodiments, the conducting material is metal.

In some embodiments, the plurality of sections comprise vias reaching through the source implant into the base.

In some embodiments, the plurality of sections each have a rectangular footprint.

In some embodiments, the plurality of sections each have a circular footprint.

In some embodiments, the base comprises a p-type semiconductor and the source implant comprises an n-type semiconductor.

In some embodiments, the field effect transistor comprises a power metal oxide semiconductor field effect transistor.

Some embodiments may include a field effect transistor with a transistor cell. The field effect transistor may include: a base deposited within an epitaxial layer; a source implant extending into the base, wherein the epitaxial layer, the base, and the source implant form a continuous plane surface; a gate in contact with both the epitaxial layer and the base; and the contact groove filled with a conductive material creating a base-source contact groove reaching through the insulating layer to the surface of the source implant and comprising a plurality of sections spaced apart from each other reaching through the source implant into the base.

In some embodiments, each of the plurality of sections is equally spaced apart.

In some embodiments, the conducting material is metal.

In some embodiments, the plurality of sections comprise vias reaching through the source implant into the base.

In some embodiments, the plurality of sections each have a rectangular footprint.

In some embodiments, the plurality of sections each have a circular footprint.

Some embodiments may include a device comprising: a housing containing a microcontroller and at least one field effect transistor. The at least one field effect transistor may comprise a plurality of cells including: a base deposited within an epitaxial layer; a source implant extending into the base, wherein the epitaxial layer, the base, and the source implant form a continuous plane surface; a gate in contact with both the epitaxial layer and the base; and the contact groove filled with a conductive material creating a base-source contact groove reaching through the insulating layer to the surface of the source implant and comprising a plurality of sections spaced apart from each other reaching through the source implant into the base.

In some embodiments, the microcontroller is formed on a first chip; the at least one field effect transistor is formed on a second chip; and the first chip and the second chip are connected with the housing by wire bonding.

In some embodiments, the microcontroller and the at least one field effect transistor are formed on a single chip.

In some embodiments, each of the plurality of sections is equally spaced apart.

In some embodiments, the plurality of sections comprise vias reaching through the source implant into the base.

DETAILED DESCRIPTION

The teachings of the present disclosure may be embodied in metal oxide semiconductor field effect transistors (MOSFETs) and methods for their manufacture.

Figure 1A:
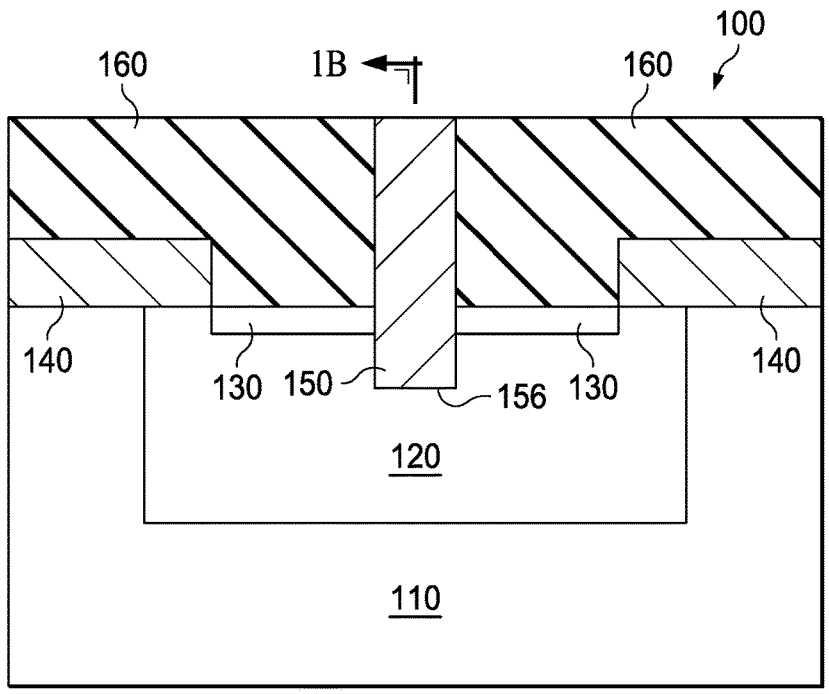
FIG. 1A is a drawing showing a cross section taken through a portion of a prior art MOSFET.
Figure 1B:
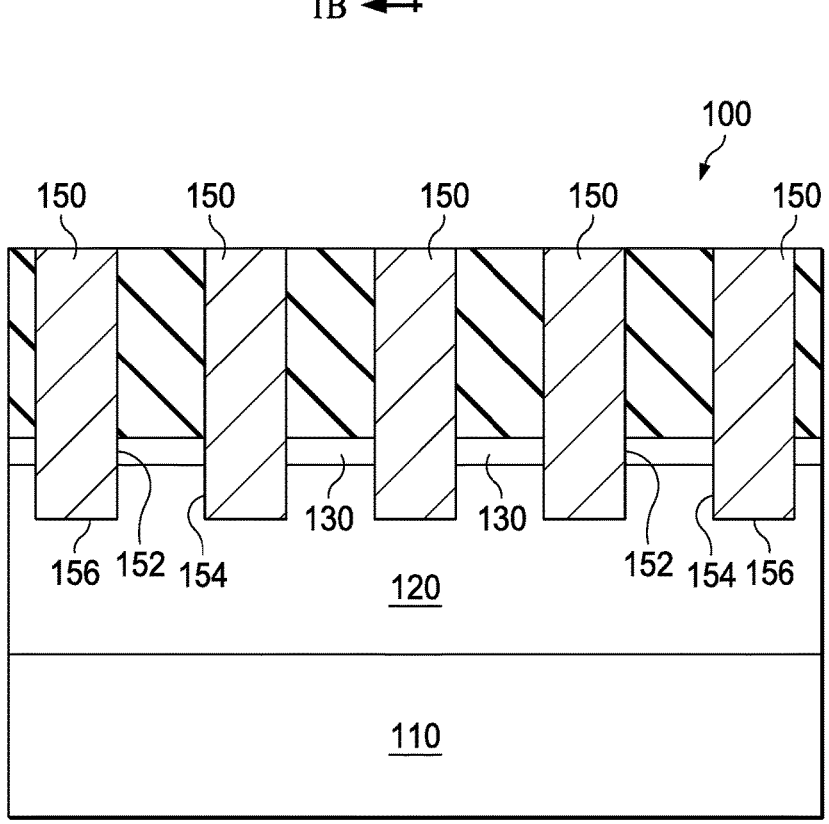
FIG. 1B is a drawing showing a cross section through a portion of the prior art MOSFET taken perpendicular to the cross-section of FIG. 1A.
Figure 2A:
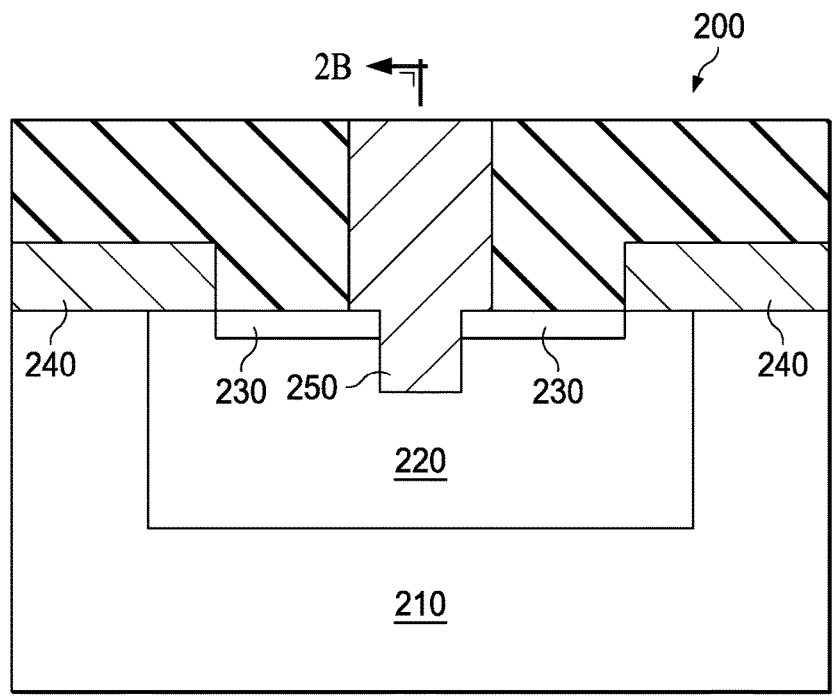
FIG. 2A is a drawing showing a cross section through a portion of an example MOSFET with increased connection between the contact and the source implant.
Figure 2B:
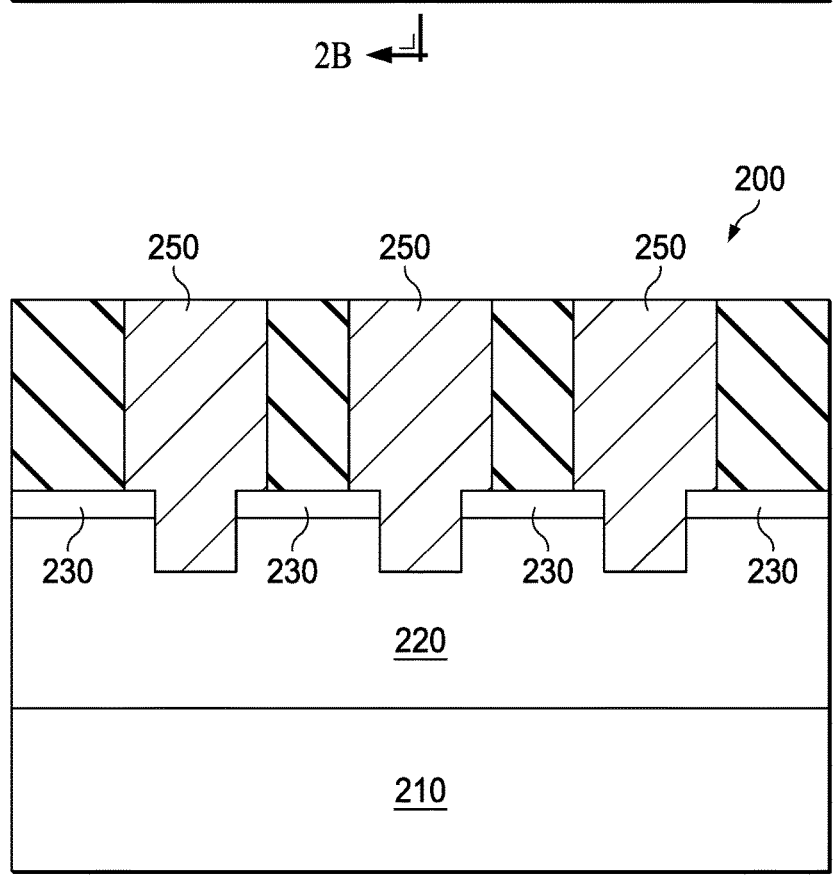
FIG. 2B is a drawing showing a cross section through a portion of the example MOSFET taken perpendicular to the cross-section of FIG. 2A.

FIG. 2A is a drawing showing a cross section through a portion of an example MOSFET 200 with increased connection area between the contact and the source implant. FIG. 2B is a drawing showing a cross section through a portion of the example MOSFET taken perpendicular to the cross-section of FIG. 2A. As shown, contact 250 extends through a via to make contact with both base 220 and source implant 230. In contrast to MOSFET 100, the via has an irregular shape, resulting in a stepped down portion at the end 256 of contact 250.

The change in via shape provides a greater area of connection between contact 250 and source 230. Contact 250, like contact 150, connects to the base 220 at the bottom 256 of contact 250 and along the lower portion 254 of the sides of contact 250. Area 252, however, provides a significantly larger surface area on contact 250 in connection with source 230. For MOSFET 100, just the sides 152 of contact 150 are in connection along the thickness of source 130. In contrast, MOSFET 200 includes connection along the top surface of source 230 as well. The increase in connection surface area 252 may require additional process steps to open the vias as shown, as well as consuming additional surface area for contact 230 in the final design of the MOSFET, as well.

Figure 3A:
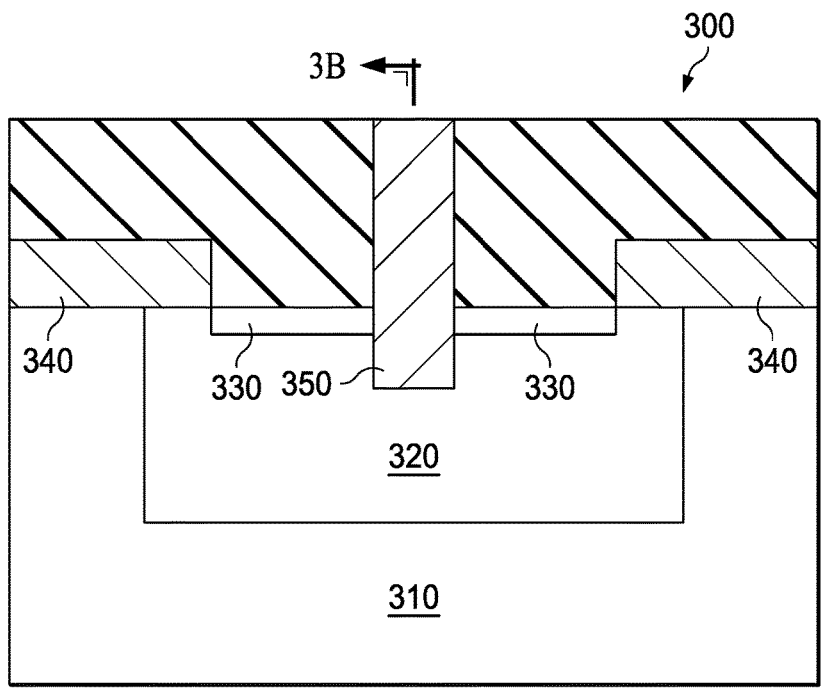
FIG. 3A is a drawing showing a cross section through a portion of an example MOSFET with increased connection between the contact and the source implant, according to teachings of the present disclosure.
Figure 3B:
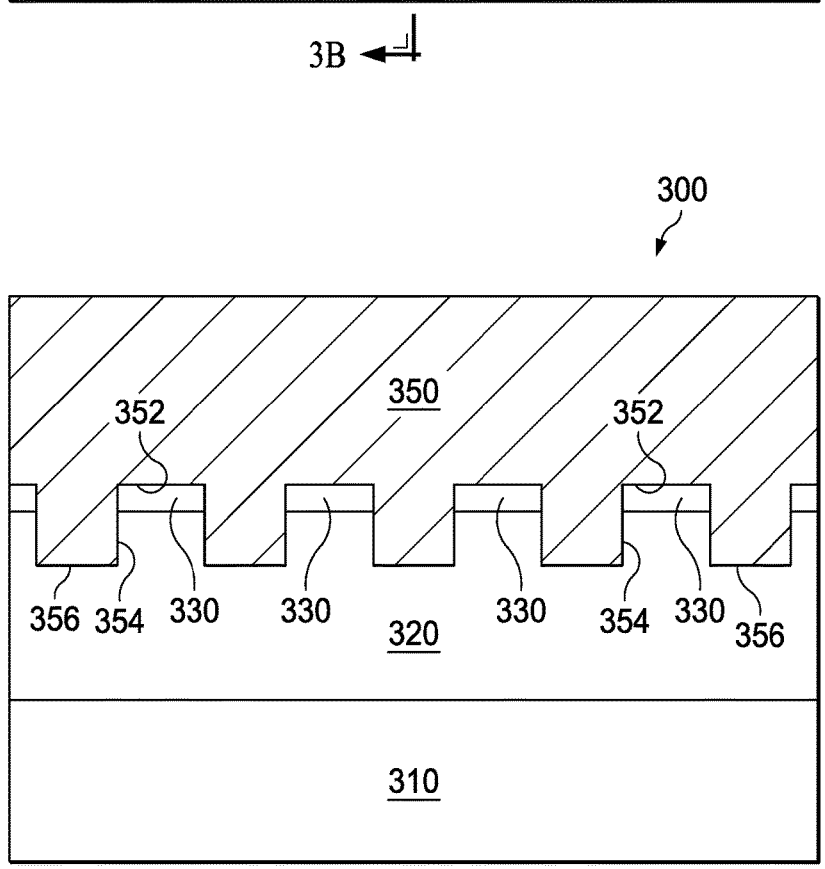
FIG. 3B is a drawing showing a cross section through a portion of the example MOSFET taken perpendicular to the cross-section of FIG. 3A.

FIG. 3A is a drawing showing a cross section through a portion of an example MOSFET 300 with increased connection between the contact 350 and the source implant 330, according to teachings of the present disclosure. FIG. 3B is a drawing showing a cross section through a portion of the example MOSFET 300 taken perpendicular to the cross-section of FIG. 3A. Rather than adding a step to the via as shown in FIGS. 2A and 2B, the via used to manufacture MOSFET 300 has the shape of a groove through insulating layer 370, with vias extending from the surface of source implant 330 down through the source implant 330 into base 320.

When filled with a conducting material, the resulting base-source contact groove 350 provides increased surface area in contact with base 320. FIG. 3B shows the additional surface area 352 along the top surface of source implant 330. In some embodiments, contact groove 350 is connected to source implant 330 along the full extent of source implant 330 between each set of adjacent vias. The MOSFET 300 includes a single contact groove 350 (e.g., filled with tungsten) with two different elevations, that makes electrical connection to both base 320 and source 330. The surface area in contact in MOSFET 300 is not only in the vertical sides but combines both the vertical and the horizontal extent 352.

Figure 4A:
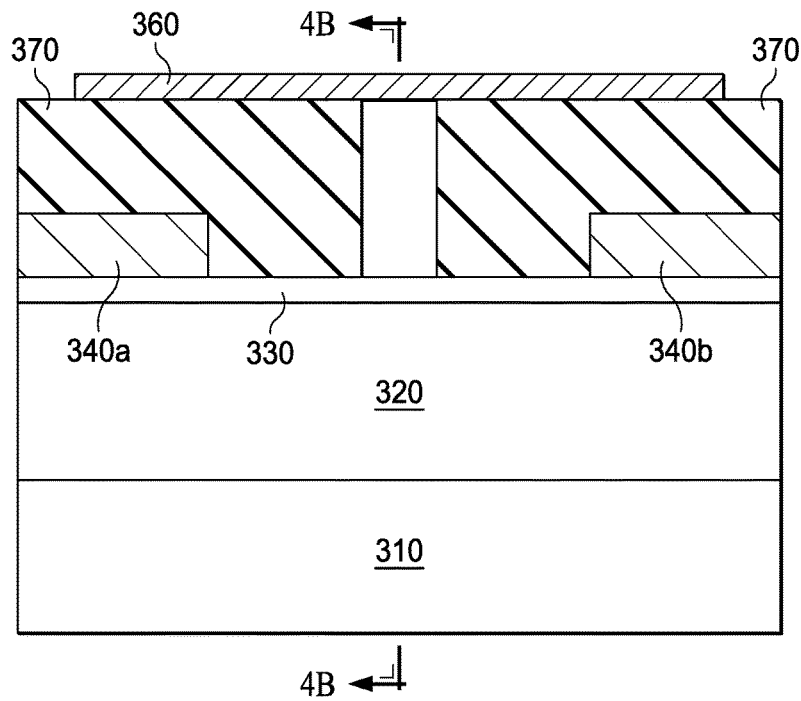
FIGS. 4A-4C are drawings showing intermediate process steps that may be used to manufacture the example MOSFET shown in FIGS. 3A and 3B.
Figure 4B:
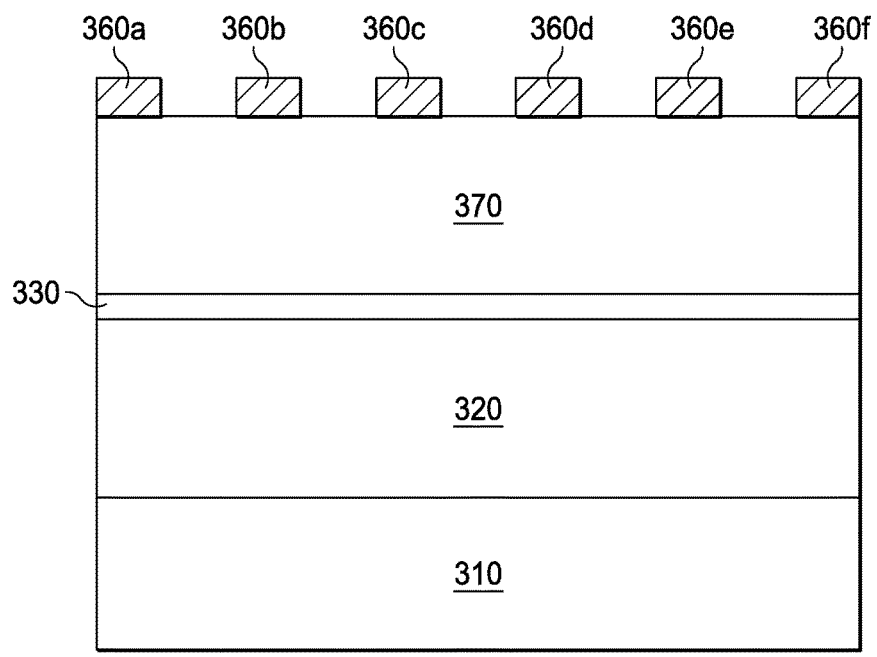
Figure 4C:
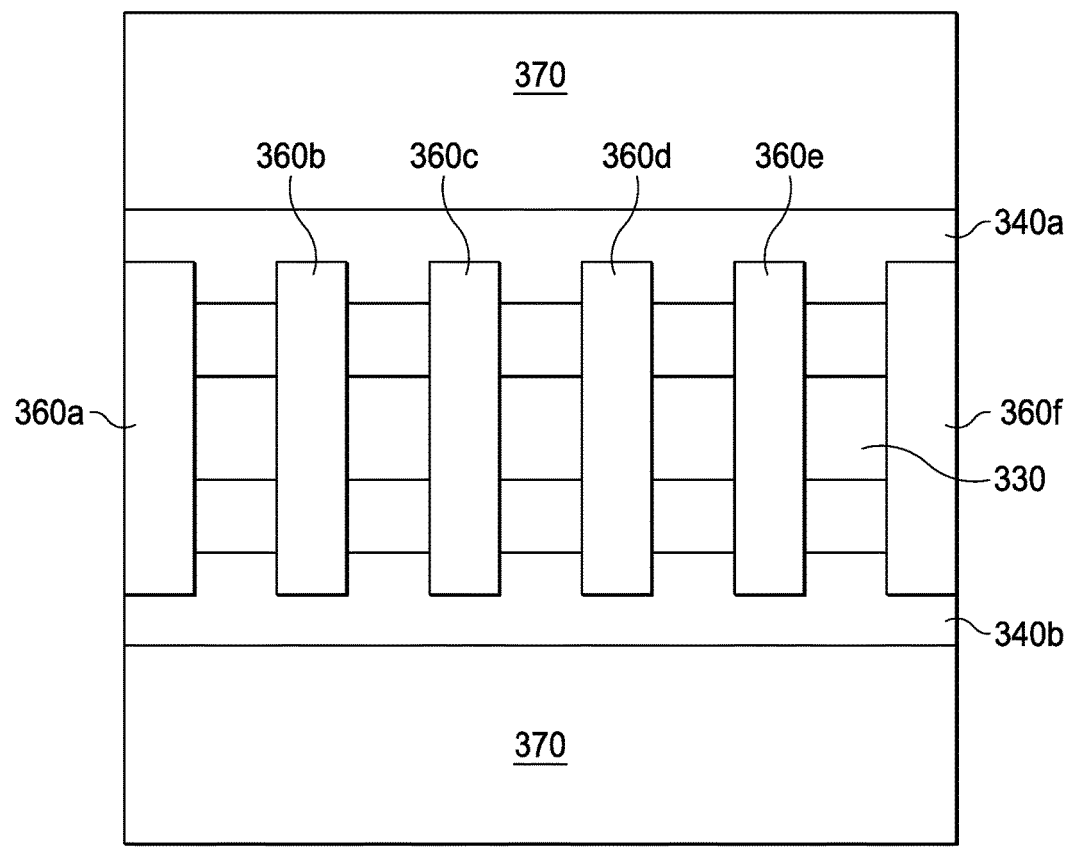

FIGS. 4A-4C are drawings showing intermediate process steps that may be used to manufacture the example MOSFET 300 shown in FIGS. 3A and 3B.

FIG. 4A shows a portion of an intermediate state after patterning and etching the contact groove. To provide the vias through source implant 330 and into base 320, orthogonal grooves are patterned and etched into the silicon to expose the base area. To pattern the orthogonal grooves, photoresist 360 may be used as shown in FIGS. 4A-C. The etch process is self-aligning with the intersection of the contact groove and the orthogonal grooves. After the orthogonal grooves are etched, there is a stair step up and down along the contact groove. FIG. 3B shows the contact groove with the steps up and down after it is filled with conductor 350.

FIG. 4C shows a top down view of the same intermediate state. The contact groove exposing source implant 330 runs horizontally in the Figure as shown, and stripes of resist extend vertically. A selective etch of the silicon will be performed, in which the oxide self-aligns the recesses without requiring exact alignment of the process equipment. In contrast to other methods, the procedures disclosed herein do not require additional area to increase the connection between the source 330 and the contact. In addition, the procedures may be insensitive to mask alignment at the same time they provide better connection to the source 330.

In some embodiments, a field effect transistor includes at least one or a plurality of transistor cells. Each cell comprises a base within an epitaxial layer, a source implant extending into the base, an insulating layer arranged on top of the epitaxial layer and comprising at least one gate covering a surface area of the base between the source implant and the epitaxial layer, and a base-source contact groove reaching through the insulating layer to the surface of the source implant and comprising a plurality of sections spaced apart from each other and reaching through the source implant into the base.

In some embodiments, the plurality of sections are equally spaced apart. The base-source contact groove may be filled with conducting material. The conducting material may be metal. In some embodiments, the plurality of sections comprise vias reaching into the base. The vias may each have matching footprints, (e.g., square, rectangular, or a circular footprints).

Figure 5:
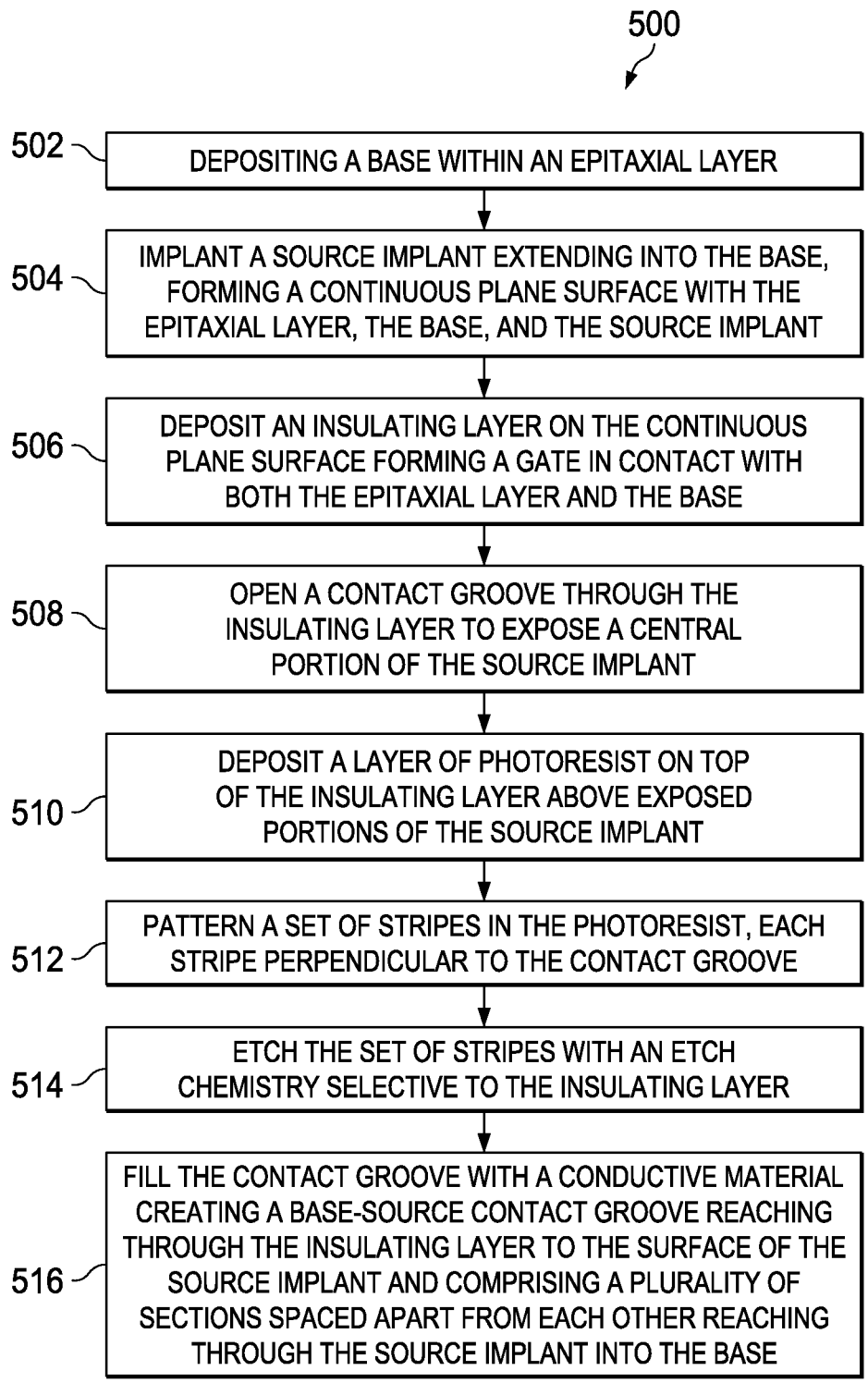
FIG. 5 is a flowchart showing an example method for manufacturing a MOSFET according to teachings of the present disclosure.

FIG. 5 is a flowchart showing an example method 500 for manufacturing a MOSFET according to teachings of the present disclosure. The example embodiment described below and shown in FIG. 5 need not be performed in exactly that order and may include more or fewer steps as appropriate.

Method 500 may include Step 502, including depositing a base 320 within an epitaxial layer 310. Base 320 may comprise a P-type semiconductor. Epitaxial layer 310 may include an N-epi/N+++ substrate.

Method 500 may include Step 504, including implanting a source implant 330 extending into the base 320. Source implant 330 may comprise an N-type semiconductor. In some embodiments, after Step 504 is complete, the epitaxial layer 310, the base 320, and the source implant 330 form a continuous plane surface.

Method 500 may include Step 506, including depositing an insulating layer 370 on the continuous plane surface forming a gate 340 in contact with both the epitaxial layer 310 and the base 320.

Method 500 may include Step 508, including opening a contact groove through the insulating layer 370 to expose a central portion of the source implant 330.

Method 500 may include Step 510, including depositing a layer of photoresist 360 on top of the insulating layer 370 extending above exposed portions of the source implant 330.

Method 500 may include Step 512, including patterning a set of stripes 360*a*-360*f* in the photoresist 360, each stripe perpendicular to the contact groove.

Method 500 may include Step 514, including etching the set of stripes with an etch chemistry selective to the insulating layer 370.

Method 500 may include Step 516, including filling the contact groove with a conductive material creating a base-source contact groove 350 reaching through the insulating layer 370 to the surface of the source implant 330 and comprising a plurality of sections spaced apart from each other reaching through the source implant 330 into the base 320.

Although the teachings of the present disclosure have been described in detail in relation to the embodiments depicted in the Figures, persons having ordinary skill in the art will be able to apply these teachings beyond those embodiments without departing from the inventive scope of this disclosure. The embodiments are examples only and do not, therefore, limit the teachings but merely illustrate them.

The invention claimed is:

1. A method for manufacturing a field effect transistor with a transistor cell, the method comprising:
   depositing a base within an epitaxial layer;
   implanting a source implant extending into the base;
   wherein the epitaxial layer, the base, and the source implant form a continuous plane surface;
   depositing an insulating layer on the continuous plane surface;
   forming a gate in contact with both the epitaxial layer and the base;
   opening a contact groove through the insulating layer to expose a central portion of the source implant;
   depositing a layer of photoresist on top of the insulating layer above exposed portions of the source implant, wherein the layer of photoresist leaves the contact groove open as well as a surface portion of the source implant immediately adjacent the contact groove;
   patterning a set of stripes in the photoresist, each stripe perpendicular to the contact groove;
   etching the set of stripes with an etch chemistry selective to the insulating layer; and
   filling the contact groove with a conductive material creating a base-source contact groove reaching through the insulating layer to the surface of the source implant having surface area in contact with the surface of the source implant as well as side walls in contact with the source implant and comprising a plurality of sections spaced apart from each other reaching through the source implant into the base.

2. A method according to claim 1, wherein each of the plurality of sections is equally spaced apart.

3. A method according to claim 1, wherein the conducting material is metal.

4. A method according to claim 1, wherein the plurality of sections comprise vias reaching through the source implant into the base.

5. A method according to claim 1, wherein the plurality of sections each have a rectangular footprint.

6. A method according to claim 1, wherein the plurality of sections each have a circular footprint.

7. A method according to claim 1, wherein the base comprises a p-type semiconductor and the source implant comprises an n-type semiconductor.

8. A method according to claim 1, wherein the field effect transistor comprises a power metal oxide semiconductor field effect transistor.

* * * * *